United States Patent
Ishida et al.

(10) Patent No.: US 8,933,716 B2
(45) Date of Patent: Jan. 13, 2015

(54) TEST APPARATUS AND TESTING METHOD

(75) Inventors: Masahiro Ishida, Tokyo (JP); Toshiyuki Okayasu, Tokyo (JP); Kazuhiro Yamamoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 916 days.

(21) Appl. No.: 13/062,937

(22) PCT Filed: Sep. 3, 2009

(86) PCT No.: PCT/JP2009/004357
§ 371 (c)(1),
(2), (4) Date: Apr. 5, 2011

(87) PCT Pub. No.: WO2010/029709
PCT Pub. Date: Mar. 18, 2010

(65) Prior Publication Data
US 2011/0181308 A1    Jul. 28, 2011

(30) Foreign Application Priority Data

Sep. 10, 2008  (WO) .................. PCT/JP2008/002509

(51) Int. Cl.
G11C 29/56    (2006.01)
G01R 31/317   (2006.01)
G11C 29/12    (2006.01)

(52) U.S. Cl.
CPC .......... *G11C 29/56* (2013.01); *G01R 31/31721* (2013.01); *G11C 29/12005* (2013.01); *G11C 2029/5602* (2013.01)
USPC ........................ 324/750.02; 324/702; 324/714

(58) Field of Classification Search
CPC ............. G01R 35/065; G01R 31/3191; G01R 31/2886
USPC .............................. 324/750.02, 702, 714, 750
See application file for complete search history.

(56) References Cited

U.S. PATENT DOCUMENTS

| | | | |
|---|---|---|---|
| 5,760,599 A * | 6/1998 | Ehiro ........................ 324/762.09 |
| 6,949,942 B2 | 9/2005 | Eldridge et al. |
| 7,965,092 B2 * | 6/2011 | Nakamura et al. ....... 324/762.01 |

(Continued)

FOREIGN PATENT DOCUMENTS

| | | |
|---|---|---|
| CN | 101101313 A | 1/2008 |
| JP | 2001-004692 A | 1/2001 |

(Continued)

OTHER PUBLICATIONS

Office Action dated Feb. 4, 2013 for related Japanese Patent Application No. 2010-528613 and its English summary provided by the clients.

(Continued)

*Primary Examiner* — Arleen M Vazquez
*Assistant Examiner* — Dominic Hawkins
(74) *Attorney, Agent, or Firm* — Ladas & Parry, LLP

(57) ABSTRACT

A main power supply supplies a power supply voltage to a power supply terminal of a DUT. A control pattern generator generates a control pattern including a pulse sequence. A compensation circuit intermittently injects a compensation current to the power supply terminal of the DUT via a path different from that of the main power supply. A switch is arranged between an output terminal of a voltage source and the power supply terminal of the DUT, and is turned on and off according to the control pattern.

39 Claims, 11 Drawing Sheets

(56) References Cited

U.S. PATENT DOCUMENTS

| | | | |
|---|---|---|---|
| 2002/0186003 A1* | 12/2002 | Ebiya | 324/158.1 |
| 2002/0186037 A1 | 12/2002 | Eldridge et al. | |
| 2008/0100328 A1* | 5/2008 | Dhong et al. | 324/765 |
| 2008/0231297 A1* | 9/2008 | Kang | 324/755 |
| 2009/0001993 A1* | 1/2009 | Lindsey et al. | 324/509 |
| 2009/0287431 A1* | 11/2009 | Suda | 702/58 |

FOREIGN PATENT DOCUMENTS

| | | |
|---|---|---|
| JP | 2001-4692 | 1/2002 |
| JP | 2005-516226 | 2/2005 |
| JP | 2005-516226 A | 6/2005 |
| JP | 2007-205813 | 8/2007 |
| KR | 10-2004-0079960 | 9/2004 |
| KR | 10-2008-0055900 | 6/2008 |
| TW | 422927 | 2/2001 |
| TW | 200745582 | 12/2007 |
| WO | 01-73929 | 10/2001 |
| WO | 03-065064 | 8/2003 |
| WO | 2007/049476 | 5/2007 |
| WO | 2007-049476 | 5/2007 |

OTHER PUBLICATIONS

Office Action dated Feb. 4, 2013 for related Taiwanese Patent Application No. 98130396 and its English summary.

Office Action for KR Patent No. 10-2011-7008283 dated Jul. 18, 2012 and its English translation.

PCT International Search Report and Written Opinion issued in PCT Application No. PCT/JP2008/002509 and mailed on Dec. 9, 2008, with English-language translations.

PCT International Preliminary Report on Patentability issued in PCT/ JP2008/002509 and mailed on Mar. 15, 2011, with English-language translations.

PCT International Search Report and Written Opinion issued in PCT Application No. PCT/JP2009/004357 and mailed on Nov. 24, 2009, with English-language translations.

PCT International Preliminary Report on Patentability issued in PCT/JP2009/004357 and mailed on Mar. 15, 2011, with English-language translations.

Office Action for corresponding Chinese Patent Application No. 200980135553.5 issued on Dec. 18, 2012 and its English translation.

* cited by examiner

TEST APPARATUS AND TESTING METHOD

CROSS REFERENCE TO RELATED APPLICATIONS

This application is the U.S. National Stage of International Patent Application No. PCT/JP2009/004357 filed on Sep. 3, 2009 which claims priority to International Patent Application No. PCT/JP2008/002509 filed on Sep. 10, 2008, the disclosures of which are hereby incorporated by reference in their entirety.

BACKGROUND OF THE INVENTION

1. Field of the Invention

The present invention relates to a technique for stabilizing a power supply.

2. Description of the Related Art

In a case of testing a semiconductor integrated circuit (which will be referred to as the "DUT" hereafter) such as a CPU (Central Processing Unit), DSP (Digital Signal Processor), memory, or the like, that makes use of CMOS (Complementary Metal Oxide Semiconductor) technology, electric current flows through flop-flops and latches in the DUT in the operating state in which a clock is supplied. When the clock supply is stopped, the circuit enters a static state, thereby reducing the current. That is to say, the sum total of consumed current (load current) that flows through the DUT changes over time according to the proportion (operating ratio) of gates (transistors) that are in the operating state, i.e., changes over time according to the test content.

A power supply circuit configured to supply a power supply voltage to the DUT is configured employing a regulator. Ideally, such a power supply circuit is capable of providing a constant power supply voltage regardless of the load current. However, in practice, such a power supply circuit has an output impedance that is not negligible. Furthermore, the impedance component between the power supply circuit and the DUT is also not negligible. Accordingly, such an arrangement has a problem of fluctuation in the power supply voltage due to fluctuation in the load.

Such fluctuation in the power supply voltage has a serious effect on the test margin to be applied to the DUT. Furthermore, such fluctuation in the power supply voltage also has an effect on the operation of other circuit blocks in the test apparatus, such as a pattern generator configured to generate a pattern to be supplied to the DUT, and a timing generator configured to control the transition timing of the pattern. This leads to deterioration of the precision of the test.

In order to solve such a problem, a technique has been proposed in which the power supply voltage is corrected according to a test pattern supplied to the DUT so as to stabilize the power supply voltage at the DUT terminal (Patent document 1).

[Patent Document 1]
Japanese Patent Application Laid Open No. 2007-205813

In the technique disclosed in Patent document 1, such an arrangement compensates for the power supply voltage after it reads out a test pattern applied to the DUT. Accordingly, in some cases, such an arrangement cannot follow a rapid change in the power supply voltage, leading to a delay in the power supply voltage compensation according to the test pattern. Furthermore, such a compensation circuit is configured as a part of the power supply circuit. Accordingly, such an arrangement has a problem in that such a compensation circuit can compensate for the power supply voltage only in the frequency range limited by the impedance between the power supply circuit and the DUT. Moreover, such an arrangement requires a multi-bit D/A converter according to the range and resolution of the power supply voltage compensation.

SUMMARY OF THE INVENTION

The present invention has been made in order to solve such a problem. Accordingly, it is a general purpose of the present invention to provide a test apparatus which is capable of compensating for fluctuation in the power supply voltage.

An embodiment of the present invention relates to a circuit system. The circuit system comprises: a semiconductor device; a main power supply configured to supply a power supply voltage to a power supply terminal of the semiconductor device; a control pattern generator configured to generate a control pattern including a pulse sequence that corresponds to processing to be executed by the semiconductor device; and a compensation circuit configured to intermittently inject a compensation current into a power supply terminal of the semiconductor device, via a path different from that of the main power supply, according to the control pattern during a period in which the semiconductor device executes the processing.

Another embodiment of the present invention also relates to a circuit system. The circuit system comprises: a semiconductor device; a main power supply configured to supply a power supply voltage to a power supply terminal of the semiconductor device; a control pattern generator configured to generate a control pattern including a pulse sequence that corresponds to processing to be executed by the semiconductor device; and a compensation circuit configured to intermittently draw a part of the power supply current from the main power supply as a compensation current, via a path different from that of the semiconductor device, according to the control pattern during a period in which the semiconductor device executes the processing.

Also, the control pattern generator may be included as a built-in component in the semiconductor device. Also, the control pattern generator may be configured to change the duty ratio of the pulse sequence according to the operating state of the semiconductor device.

Yet another embodiment of the present invention relates to a test apparatus configured to test a device under test. The test apparatus comprises: a main power supply configured to supply a power supply voltage to a power supply terminal of the device under test; a control pattern generator configured to generate a control pattern including a pulse sequence that corresponds to processing to be executed by the device under test; and a compensation circuit configured to intermittently inject a compensation current (compensation charge) into a power supply terminal of the device under test, via a path different from that of the main power supply, according to the control pattern during a period in which the device under test executes the processing.

With such an embodiment, by controlling the duty ratio of the pulse sequence, such an arrangement is capable of suppressing fluctuation in the power supply voltage, or of intentionally causing fluctuation in the power supply voltage. The term "duty ratio" as used here represents the temporal ratio between the high-level period and the low-level period, and represents a concept which encompasses not only the temporal ratio acquired in a single cycle, but also the average temporal ratio acquired over multiple cycles.

Also, the control pattern generator may output the control pattern, which is used to change the compensation current, to the compensation circuit a predetermined period of time before the timing of a change in the current that flows into the power supply terminal of the device under test.

In some cases, after the control pattern is applied so as to cause the compensation current to flow, delay occurs before the effects of the compensation current appear in the power supply voltage. In this case, by taking such delay into account when applying the control pattern, such an arrangement is capable of further suppressing fluctuation in the power supply voltage.

Also, the predetermined period of time may be determined as follows.

1. Outputting the control pattern, which is used to change the compensation current, to the compensation circuit at a first timing in a state in which the device under test is instructed to perform an operation that does not cause a change in the power supply voltage.

2. Next, detecting a second timing at which electrical characteristics of the device under test change as a result of supplying the control pattern.

3. Setting the predetermined period of time based upon the time difference between the first timing and the second timing.

The change in electrical characteristics produced by the device under test may also be judged to be the timing (output timing) at which data is output from the device under test. Alternatively, it may also be a change in the frequency of a ring oscillator included as a built-in component in the device under test.

Also, the wiring length between the compensation circuit and the device under test may be shorter than the wiring length between the main power supply and the device under test.

With such an arrangement, the compensation circuit does not receive the effects of the impedance between the main power supply and the device under test. Thus, such an arrangement is capable of compensating for fluctuation in the power supply voltage up to high-frequency voltage fluctuation.

Also, the compensation circuit may comprise: a voltage source configured to generate a higher voltage than the power supply voltage generated by the main power supply; and a switch arranged between an output terminal of the voltage source and the power supply terminal of the device under test, and configured to switch on and off according to the control pattern.

Also, the compensation circuit may comprise: a current source configured to generate a predetermined constant current; and a switch arranged between the current source and the power supply terminal of the device under test, and configured to switch on and off according to the control pattern.

Yet another embodiment of the present invention also relates to a test apparatus configured to test a device under test. The test apparatus comprises: a main power supply configured to supply the power supply voltage to a power supply terminal of the device under test; a control pattern generator configured to generate a control pattern including a pulse sequence; and a compensation circuit configured to intermittently draw a power supply current from the main power supply to a path different from that of the device under test, according to the control pattern.

With such an embodiment, by controlling the duty ratio of the pulse sequence, such an arrangement is capable of suppressing fluctuation in the power supply voltage, or intentionally causing fluctuation in the power supply voltage.

Also, the compensation circuit may comprise: a voltage source configured to generate a higher voltage than the power supply voltage generated by the main power supply; and a switch arranged between the output terminal of the voltage source and the power supply terminal of the device under test, and configured to switch on and off according to the control pattern.

The compensation circuit may comprise: a current source configured to generate a predetermined constant current; and a switch arranged between the current source and the power supply terminal of the device under test, and configured to switch on and off according to the control pattern.

Yet another embodiment of the present invention also relates to a test apparatus. The test apparatus comprises: a main power supply configured to supply a power supply voltage to a power supply terminal of a device under test; a control pattern generator configured to generate a control pattern including a pulse sequence; and a compensation circuit configured to intermittently draw a part of the power supply current as a compensation current from the main power supply to a path different from that of the device under test according to the control pattern.

With such an embodiment, by controlling the duty ratio of the pulse sequence, such an arrangement is capable of suppressing fluctuation in the power supply voltage, or intentionally causing fluctuation in the power supply voltage.

Also, the compensation circuit may comprise a switch arranged between both terminals of the main power supply, and configured to switch on and off according to the control pattern.

With the test apparatus according to any one of the several aforementioned embodiments, the control pattern may be generated as follows.

Also, the control pattern generator may change the duty ratio of the pulse sequence according to the operating state of the device under test.

The control pattern may be generated as follows.

1. Calculating, by means of a computation device, a current that flows in a state in which a predetermined test pattern is supplied to the device under test.

2. Subtracting a continuous component of the power supply current from the current per cycle, and calculating an amount of compensation current per cycle, based upon the results of the subtraction.

3. Determining the control pattern by pattern modulation so as to provide the amount of compensation current thus calculated per cycle.

The control pattern thus determined is stored in memory. When a predetermined test pattern is supplied to the device under test, a control pattern associated with the test pattern is read out. Thus, such an arrangement is capable of compensating for fluctuation in the power supply voltage.

Also, the control pattern generator may change the duty ratio of the pulse sequence such that the difference between a current that flows into the power supply terminal of the device under test and a compensation current injected by the compensation circuit is continuous over time.

Also, the control pattern generator may change the duty ratio of the pulse sequence such that the difference between a current that flows into the power supply terminal of the device under test and a compensation current injected by the compensation circuit is constant over time.

Also, the control pattern generator may change the duty ratio of the pulse sequence such that the sum of the current that flows into the power supply terminal of the device under test and a compensation current drawn by the compensation circuit is continuous over time.

Also, when a current that flows into the power supply terminal of the device under test rises at a given timing, the control pattern generator may change the duty ratio of the pulse sequence such that a compensation current drawn by the compensation circuit gradually rises over time before the aforementioned given timing.

The compensation current drawn by the compensation circuit is wasted. By performing the aforementioned control operation, such an arrangement is capable of reducing such waste current.

Also, when a current that flows into the power supply terminal of the device under test falls at a given timing, the control pattern generator may change the duty ratio of the pulse sequence such that a compensation current drawn by the compensation circuit gradually falls over time after the aforementioned given timing.

When the current that flows into the power supply terminal of the device under test will rise during a given period of time, the control pattern generator may change the duty ratio of the pulse sequence such that the compensation current drawn by the compensation circuit gradually rises over time from a first value to a second value before the given period of time begins, such that it is maintained at a third value that is lower than the second value during the given period of time, and such that it gradually drops over time from the second value to a fourth value after the given period of time elapses.

With such an arrangement in which the compensation current is drawn via a path different from that of the device under test, such a compensation current is wasted. By performing the aforementioned operation, such an arrangement is capable of suppressing such waste current.

Also, the control pattern generator may superimpose noise on a power supply voltage supplied to the power supply terminal of the device under test.

Such an arrangement is capable of testing noise resistance of the device under test.

Also, the control pattern generator may change the duty ratio of the pulse sequence so as to change the impedance of the power supply side as viewed from the power supply terminal.

In some cases, the performance, such as the output impedance, etc., of the power supply mounted in the test apparatus is different from the performance of a power supply to be used to supply a voltage to the device under test in practice. In general, the performance of such a power supply used in practice is lower than that of the test apparatus. By changing the duty ratio of the pulse sequence, such an arrangement is capable of emulating the performance of such a power supply to be used in practice.

Also, a test apparatus according to an embodiment may further comprise a pattern generator configured to generate a test pattern to be output to the device under test. Also, the control pattern may be determined beforehand per test pattern.

Also, a test apparatus according to an embodiment may further comprise a pattern generator configured to generate a test pattern to be output to the device under test. Also, the control pattern generator may be configured to generate the control pattern in synchronization with the test pattern.

Also, the control pattern generator may generate the control pattern using any one of $\Delta\Sigma$ modulation, pulse width modulation, and pulse density modulation.

With an embodiment, the control pattern generator may comprise: a device current modeling unit configured to generate predicted device current waveform data which defines, in the form of superposition of unit pulse currents, the waveform of a device current that is predicted to flow through the device under test when the device under test executes the processing; an impulse response waveform data providing unit configured to generate impulse response waveform data which represents the waveform of an output current that is discharged from and/or sunk to the main power supply in response to the unit pulse current being drawn from the main power supply; and a control pattern calculation unit configured to convolve the waveform represented by the predicted device current waveform data and the waveform of the unit pulse current, to convolve the waveform represented by the predicted device current waveform data and the impulse response waveform data, and to generate the control pattern based upon the waveform difference between the two waveforms thus obtained by the two convolution operations.

With such an embodiment, the device current that flows through the device under test is modeled assuming that the device current can be represented by superposition of pulse currents. Furthermore, a current that corresponds to the difference between the predicted waveform of the device current and the predicted waveform of the output current of the power supply is supplied as the compensation current. Thus, such an arrangement is capable of suppressing fluctuation in the power supply voltage.

Also, the device current modeling unit may be configured to generate the predicted device current waveform data based upon the test pattern supplied to the device under test and the circuit configuration of the device under test.

The operation, i.e., the signal processing operation, of the device under test is determined according to the test pattern. Thus, if the test pattern is known, the operating ratio (switching event density) of the transistors (gates) included within the device under test can be predicted. That is to say, such an arrangement is capable of predicting the device current based upon the device configuration and the test pattern.

Also, the impulse response waveform data may be acquired beforehand using the following operation.

1. Drawing a pulse current from an output node of the main power supply or otherwise supplying a pulse current to the output node of the main power supply in a state in which the device under test is not connected to the main power supply.

2. Measuring the waveform of fluctuation in the power supply voltage over time that occurs as a result of applying the pulse current to the main power supply.

3. Deriving the waveform of the output current discharged from and/or sunk to the main power supply based upon the temporal fluctuation waveform of the power supply voltage thus measured.

Yet another embodiment of the present invention relates to an evaluation apparatus configured to evaluate a power supply configured to supply a power supply voltage to a power supply terminal of a semiconductor device. The evaluation apparatus comprises: a current source configured to draw a pulse current from the output node of the power supply, or otherwise to supply a pulse current to the output node of the power supply; a measurement device configured to measure the temporal fluctuation waveform of the power supply voltage that occurs as a result of applying the pulse current; and an analyzer configured to derive the waveform of the output current discharged from and/or sunk to the power supply, based upon the temporal fluctuation waveform of the power supply voltage.

The waveform of the output current thus obtained according to such an embodiment can be regarded as an impulse response. When a pulse current is applied to an ideal power supply, such an ideal power supply can generate an impulse output current so as to immediately cancel out the pulse current thus applied. That is to say, the output current matches the pulse current. As the responsiveness of the power supply worsens, the difference between the output current and the pulse current becomes larger. That is to say, the waveform of the output current measured by such an apparatus can be used as an indicator that represents the responsiveness of the power supply.

Also, with yet another embodiment, by convolving the impulse response acquired by the evaluation apparatus in response to a desired current being applied to the power supply and the current waveform thus applied, such an arrangement is capable of predicting the output current of the power supply, thereby predicting the output voltage thereof.

Yet another embodiment of the present invention relates to a power supply apparatus having an emulation function. The power supply apparatus comprises: a main power supply configured to supply a power supply voltage to a power supply terminal of a device under test; a control pattern generator configured to generate a control pattern including a pulse sequence; and a compensation circuit configured to intermittently inject a compensation current into a power supply terminal of the device under test and/or to draw a part of a power supply current as a compensation current from the main power supply to a path that is different from that of the device under test, according to the control pattern during a period in which the device under test executes predetermined processing. The control pattern generator comprises: a device current modeling unit configured to generate predicted device current waveform data which defines, in the form of superposition of unit pulse currents, the waveform of a device current that is predicted to flow through the device under test when the device under test executes the processing; a first impulse response waveform data providing unit configured to provide first impulse response waveform data which represents the waveform of an output current discharged from and/or sunk to the main power supply in response to the unit pulse current being drawn from the main power supply; a second impulse response waveform data providing unit configured to provide second impulse response waveform data which represents the waveform of an output current discharged from and/or sunk to a power supply to be emulated in response to the unit pulse current being drawn from the power supply to be emulated; and a control pattern calculation unit configured to convolve the waveform represented by the predicted device current waveform data and the waveform represented by the first impulse response waveform data, to convolve the waveform represented by the predicted device current waveform data and the waveform represented by the second impulse response waveform data, and to generate the control pattern based upon the waveform difference between the two waveforms thus obtained by the two convolution operations.

The waveform obtained by convolving the waveform represented by the predicted device current waveform data and the waveform represented by the first impulse response waveform data can be used as the predicted waveform of the output current of the main power supply. Furthermore, the waveform obtained by convolving the waveform represented by the predicted device current waveform data and the waveform represented by the second impulse response waveform data can be used as the predicted waveform of the output current in a state in which the power supply to be emulated is connected. Thus, by supplying the difference between the two predicted waveforms from the compensation circuit, such an arrangement is capable of reproducing the power supply environment to be emulated.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
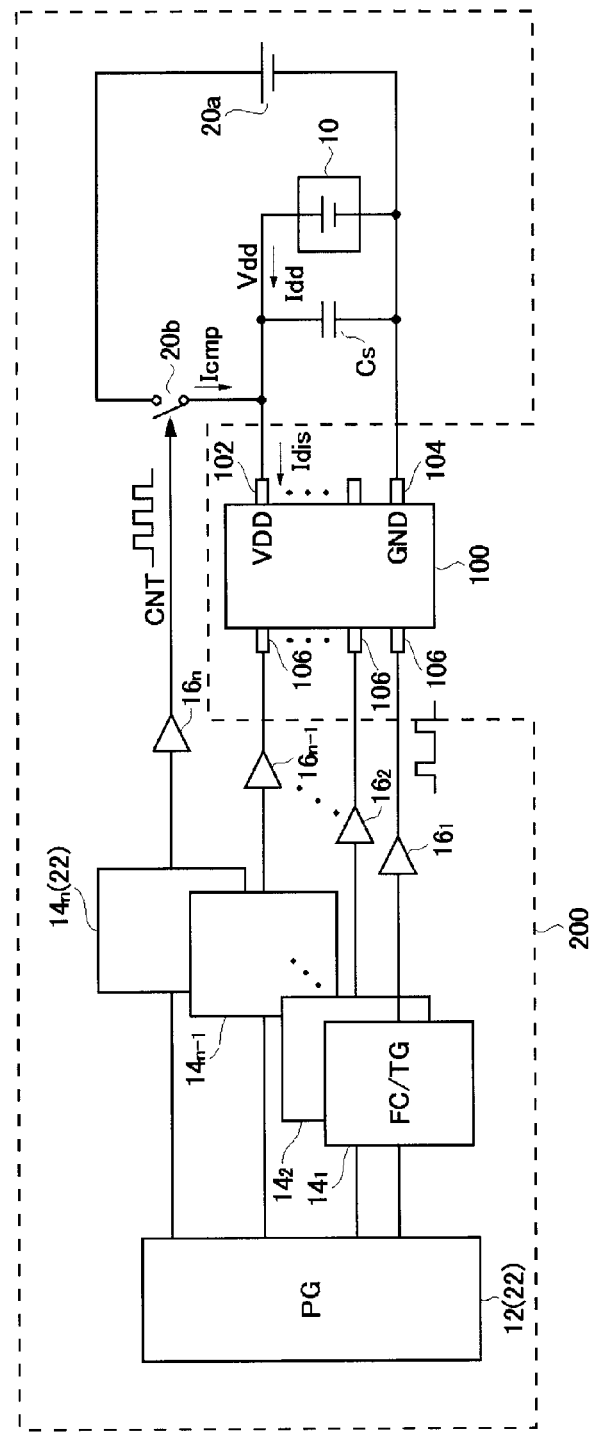
FIG. 1 is a circuit diagram which shows a configuration of a test apparatus according to a first embodiment.

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, a state represented by the phrase "the member A is connected to the member B" includes a state in which the member A is indirectly connected to the member B via another member that does not affect the electric connection therebetween, in addition to a state in which the member A is physically and directly connected to the member B. Similarly, a state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

First Embodiment

FIG. 1 is a circuit diagram which shows a configuration of a test apparatus 200 according to a first embodiment. FIG. 1 shows a semiconductor device (which will be referred to as the "DUT" hereafter) 100 to be tested, in addition to the test apparatus 200.

The DUT 100 has multiple pins including a power supply terminal 102 configured to receive a power supply voltage Vdd, and a ground terminal 104. FIG. 1 shows such a DUT 100 having a single power supply terminal 102 and a single ground terminal 104. However, the present invention is not restricted to such an arrangement. In recent years, in some cases, large-scale integrated circuits have multiple power supply terminals and multiple ground terminals. The present invention can also be effectively applied to such integrated circuits. Multiple I/O terminals 106 are provided in order to receive data from an external circuit, or to output data to an external circuit. During testing, the DUT 100 receives, via the I/O terminals 106, a test pattern output from the test apparatus 200, or outputs data that corresponds to the test pattern to the test apparatus 200.

The test apparatus 200 includes a compensation circuit 20 and a control pattern generator 22, in addition to a main power supply 10, pattern generator 12, components that include a timing generator TG and a format controller FC (such components will be denoted by the reference number "14" hereafter), and a driver 16.

The configurations and functions of the main power supply 10, the pattern generator 12, the timing generator 14, and the driver 16 are the same as those included in a typical test apparatus. Accordingly, only brief description will be made regarding such components. Description will be made below regarding an arrangement in which the DUT 100 is configured as memory.

The main power supply 10 generates the power supply voltage Vdd to be supplied to a power supply terminal 102 of the DUT 100. For example, the main power supply 10 has a configuration including a linear regulator, a switching regulator, or the like, and performs a feedback control operation such that the power supply voltage Vdd to be supplied to the power supply terminal 102 matches a target value. A capacitor Cs is provided in order to smooth the power supply voltage Vdd. The main power supply 10 generates a power supply voltage to be supplied to other blocks included in the test apparatus 200, in addition to the power supply voltage to be supplied to the DUT 100.

The test apparatus 200 includes n multiple channels CH1 through CHn. Particular channels selected from among the n channels are respectively assigned to the multiple I/O terminals 106. A timing generator 14 and a driver 16 are provided for each channel.

The pattern generator 12 generates a timing set signal (which will be referred to as the "TS signal" hereafter), and supplies the timing set signal thus generated to the timing generator 14. The timing generator 14 generates a cycle clock and a delayed clock (not shown) based upon the timing data defined by the TS signal, supplies the cycle clock to the pattern generator 12, and supplies the delayed clock to the format controller 14. Subsequently, the pattern generator 12 generates an address which indicates a storage region and a test pattern to be written, and supplies the address and the test pattern thus generated to the format controller 14.

The format controller 14 adjusts the timing of the test pattern generated by the pattern generator 12, based upon the delayed clock supplied from the timing generator 14, so as to perform a waveform shaping operation. Each driver 16 receives the address and the test pattern output from the corresponding format controller 14, and supplies the address and the test pattern to the corresponding I/O terminal 106 of the DUT 100.

An unshown comparison judgment unit compares the data read out from the DUT 100 with an expected value so as to judge the quality of the DUT 100, or to identify defective points.

The above is the schematic configuration of the test apparatus 200. The DUT 100 is configured using CMOS (Complementary Metal Oxide Semiconductor) technology. The current consumption of the DUT 100 changes according to the operation state. When a rapid change occurs in the current that flows through the DUT 100, the feedback operation by means of the main power supply 10 cannot follow the rapid change, leading to a problem in that the power supply voltage Vdd fluctuates. The compensation circuit 20 and the control pattern generator 22 are provided in order to suppress such fluctuation in the power supply voltage Vdd, which will be described below.

The control pattern generator 22 generates a control pattern CNT including a pulse sequence. The pattern generator 12 and one of the timing generators 14 are used to generate the control pattern CNT. In the test apparatus 200 shown in FIG. 1, the control pattern generator 22 has a configuration including the pattern generator 12 and the timing generator $14_n$ provided for the n-th channel CHn.

The compensation circuit 20 intermittently injects a compensation current Icmp into the power supply terminal 102 of the DUT 100 via a path different from the path including the main power supply 10. In FIG. 1, the compensation circuit 20 includes a voltage source 20a and a switch 20b. The voltage source 20a generates a voltage Vcmp higher than the power supply voltage Vdd generated by the main power supply 10. The switch 20b is arranged between the output terminal of the voltage source 20a and the power supply terminal 102 of the DUT 100, and is configured employing a bipolar transistor or a MOSFET (Metal Oxide Semiconductor Field Effect Transistor). The switch 20b is turned on and off according to a pulse sequence of the control pattern CNT. The switch 20b is arranged in the vicinity of the DUT 100. In other words, the wiring length between the switch 20b and the power supply terminal 102 of the DUT 100 is shorter than the wiring length between the main power supply 10 and the power supply terminal of the DUT 100 Also, a component configured to adjust the amount of compensation current Icmp, such as a resistor or a current source, may be provided in series with the switch 20b, or may be provided as a built-in component included within the switch 20b.

Instead of the voltage source 20a, a current source configured to generate a predetermined current may be employed.

The control pattern generator 22 changes the duty ratio of the pulse sequence of the control pattern CNT according to the operating state of the DUT 100. The operating state of the DUT 100 is controlled according to the test pattern supplied to the I/O terminals 106. Thus, the control pattern generator 22 may generate the control pattern CNT having a pulse sequence that corresponds to the test pattern, and may supply the control pattern CNT thus generated to the switch 20b.

The control pattern generator 22 changes the duty ratio of the pulse sequence such that continuity is maintained in the difference (Idis−Icmp) between the operating current (which will also be referred to as the "consumed current") that flows into the power supply terminal 102 of the DUT 100 and the compensation current Icmp that corresponds to the charge injected by the compensation circuit 20, i.e., such that the power supply current Idd output from the main power supply 10 is continuous over time. More preferably, the control pattern generator 22 changes the duty ratio of the pulse sequence such that the current difference (Idis−Icmp) is maintained at a constant level over time.

The control pattern generator 22 generates the pulse sequence of the control pattern CNT using any pulse modulation method, such as ΔΣ modulation, pulse width modulation, and pulse density modulation. The timing generator 14 included in the test apparatus 200 is capable of adjusting the positive edge timing and the pulse width per test cycle, i.e., per pulse. Accordingly, the above-described modulation method is very highly compatible with the test apparatus 200. Thus, such an arrangement has an advantage of generating a pulse sequence in a simple manner without particularly requiring an additional circuit. It should be noted that, in a case in which the control pattern generator 22 is configured without involving the pattern generator 12 and the timing generator 14, the duty ratio of the pulse sequence may be adjusted using other modulation methods such as pulse frequency modulation (PFM) or the like.

Figure 2:
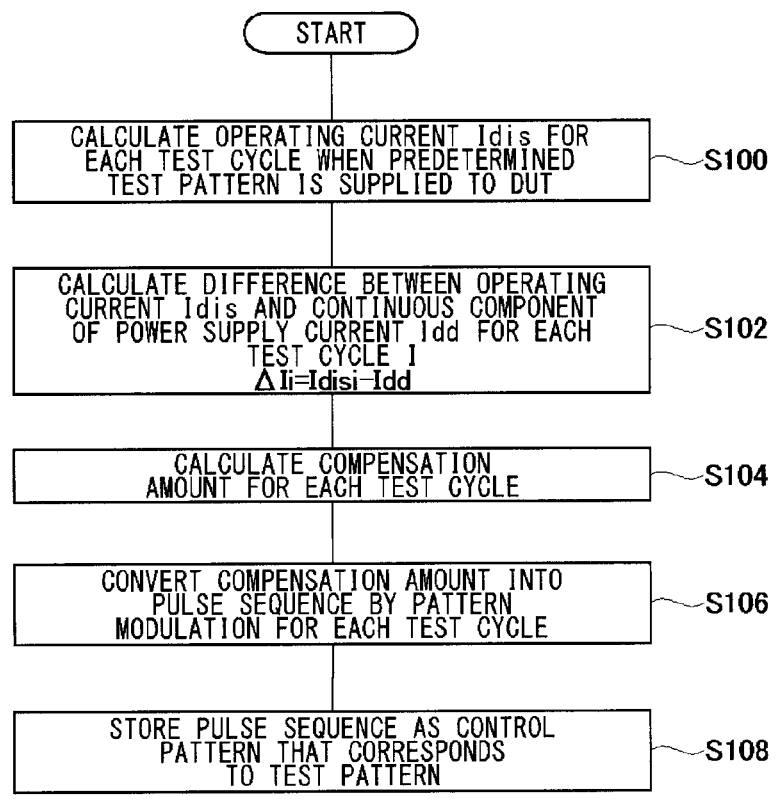
FIG. 2 is a flowchart which shows a generating method for generating a control pattern.

FIG. 2 is a flowchart which shows a method for generating the control pattern CNT. First, modeling of the DUT is performed using a circuit simulator so as to calculate the operating current Idis and the operating ratio per test cycle when a predetermined test pattern is applied (S100). Also, the operating ratio and the operating current Idis may be calculated based upon the number of transistors that are in the operating state and the current value that flows through each transistor.

The operating current Idis that flows through the DUT 100 is represented by the sum total of the current component Idd of the power supply current that is continuous over time and a component thereof that fluctuates over time per test cycle. Accordingly, the continuous component Idd is calculated, and the difference ΔIi is calculated per test cycle (S102).

$$\Delta Ii = Idis - Idd$$

The subscript i represents the identification number of the test cycle.

The required current compensation amount (or voltage compensation amount) is calculated per cycle based upon the difference current ΔIi thus calculated (S104).

The compensation amount thus calculated is converted into a pattern sequence (pulse sequence) of zeroes and ones using ΔΣ modulation, pulse width modulation, pulse density modulation, or the like (S106). The pattern sequence thus obtained is held as the control pattern CNT that corresponds to a predetermined test pattern, together with the test pattern (S106).

Figure 3:
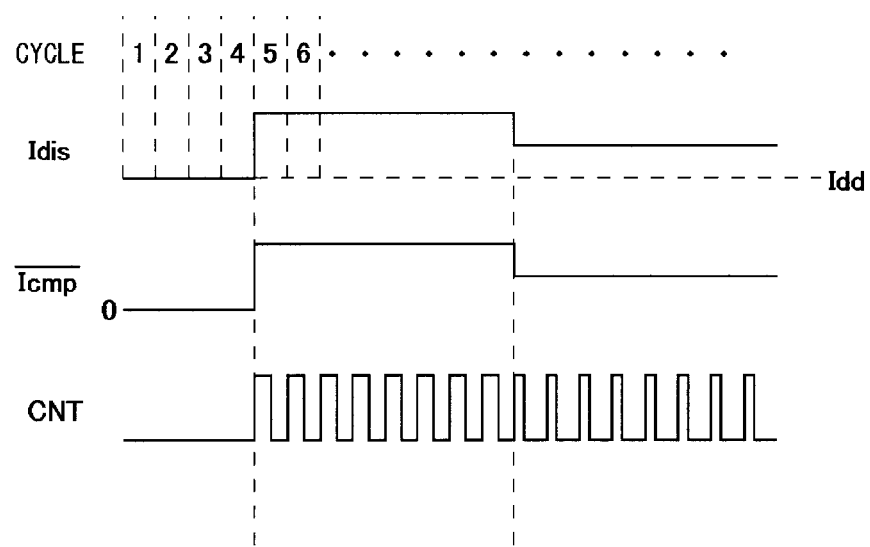
FIG. 3 is a time chart which shows an operating state of the test apparatus shown in FIG. 1.

The above is the configuration of the test apparatus 200. Next, description will be made regarding the operation of the test apparatus 200. FIG. 3 is a time chart which shows the operating states of the test apparatus 200 shown in FIG. 1. When a test pattern is supplied to a given DUT 100, the DUT 100 executes an operation according to the test pattern. Accordingly, the operating ratio of the DUT 100 changes according to the operation content, leading to fluctuation in the consumed current Idis.

The timing and amount of fluctuation in the consumed current Idis can be estimated by the aforementioned circuit simulation or the like. The pattern generator 12 outputs the control pattern CNT modulated so as to cancel out the fluctuation in the consumed current Idis, in addition to the test pattern. The ON/OFF operation of the switch 20b is controlled according to the control pattern CNT, thereby intermittently injecting the consumption current Icmp. FIG. 3 shows an envelope (or average value) of the compensation current thus intermittently injected. The compensation current Icmp cancels out the fluctuation in the consumed current Idis, thereby maintaining, at a constant level, the power supply current Idd that flows from the main power supply 10 into the power supply terminal 102. As a result, such an arrangement suppresses fluctuation in the power supply voltage Vdd.

It should be noted that the duty ratio of the pulse sequence does not necessarily require the difference current Idd=(Idis−Icmp) to be maintained at a strictly constant level. This is because the feedback operation of the main power supply 10 itself follows part of the fluctuation in the consumed current Idis. That is to say, it is only necessarily for the compensation current Icmp to cancel out a high-frequency component, which is a part of the fluctuation in the consumed current Idis that cannot be fed back by the main power supply 10.

As described above, the test apparatus 200 according to the embodiment is capable of canceling out fluctuation in the consumed current Idis of the DUT 100, thereby suppressing fluctuation in the power supply voltage Vdd. By suppressing such fluctuation in the power supply voltage Vdd, such an arrangement provides improved testing precision.

This technique has the following advantages in comparison with conventional techniques, a typical example of which is disclosed in Patent document 1.

Advantage 1.

With conventional techniques, a test pattern is read out, and signal processing is performed on the test pattern thus read out so as to compensate for fluctuation in the power supply voltage. Accordingly, such an arrangement has a problem of limited responsiveness to a rapid change in the power supply voltage. In contrast, with the embodiment, a compensation control pattern is prepared beforehand in addition to a test pattern, thereby enabling such a rapid change in the power supply voltage to be followed.

Advantage 2.

The capacitor Cs is connected to the power supply terminal 102 of the DUT 100. Accordingly, such a conventional method in which the target value of the power supply voltage is changed according to the test pattern has a problem in that the current consumption fluctuation compensation is delayed according to the time constant of the capacitor Cs.

With the embodiment, a delay also occurs between the timing at which a given control pattern CNT is supplied to the switch 20b and the timing at which the compensation current Icmp that corresponds to that timing cancels out the fluctuation in the consumed current Idis. However, with the technique according to the embodiment, the control pattern is generated for the compensation operation in addition to the test pattern to be applied to the DUT. Thus, such an arrangement is capable of supplying the compensation control pattern before it supplies the test pattern, taking into account that such a delay will occur. As a result, such an arrangement provides improved responsiveness to fluctuation in the load, in comparison with conventional techniques, thereby suppressing fluctuation in the power supply voltage Vdd.

The time offset to be applied in order to supply the compensation control pattern before the test pattern is supplied is determined according to the flow described below.

Step 1.

A test pattern that does not cause fluctuation in the power supply voltage is supplied to the DUT 100. In this state, the compensation control pattern is switched at a given timing so as to intentionally change the power supply voltage. The compensation control pattern to be used in this step may be generated according to the flow shown in FIG. 2, based upon a test pattern that causes fluctuation in the power supply voltage.

Step 2.

When the power supply voltage changes in the state in Step 1, the circuit state of the DUT changes according to the change in the power supply voltage. The time difference between the timing at which the circuit state changes according to the change in the power supply voltage and the timing at which the control pattern is switched is set to the aforementioned time offset. The change in the circuit state can be detected using the method described below.

The amount of change in the phase (output timing) of the output data from the DUT is detected. The phase of the output data output from the DUT changes according to the change in the power supply voltage. Thus, by measuring the time difference between the output timings before and after the power supply voltage changes, such an arrangement can use the time difference thus measured as the aforementioned time offset.

By sweeping the timing of a strobe signal to be used to latch each bit of the output data at predetermined intervals of time, and by judging whether or not the data sequence thus latched matches an expected value for each timing of the strobe signal, such an arrangement is capable of detecting the output timing. This operation can be realized using a typical function installed in the test apparatus.

A single measurement provides only a single logical state detected in a particular timing. However, by applying several test patterns that cause fluctuation in the power supply voltage, and by sweeping the strobe signal timing, such an arrangement is capable of detecting the phase of the output timing based upon the change in the logical state detection result.

In a case in which a multi-strobe function is installed in the test apparatus, such an arrangement may use the multi-strobe function. The multi-strobe function is a function for generating a multi-phase strobe signal sequence for each data cycle and latching the data at a timing of each strobe signal so as to judge the logical state. In a case in which such a multi-strobe function is employed, such an arrangement has an advantage in that there is no need to repeatedly apply the same control pattern.

In some cases, the DUT includes an oscillator such as a ring oscillator or the like as a built-in component in order to detect the temperature or the power supply voltage. In this case, such an arrangement may detect the timing at which the frequency of the oscillator changes, instead of detecting the change in the output timing.

By obtaining the difference (delay) between the timing at which the control pattern is switched and the timing at which the circuit state changes using one of the aforementioned methods, and by supplying the control pattern at the calculated delay timing before the test pattern is supplied, such an arrangement provides more accurate compensation.

Advantage 3.

With the conventional techniques, the power supply voltage Vdd output from the power supply is changed. Accordingly, such an operation is affected by the impedance that occurs in wiring between the power supply and the DUT, leading to a problem in that compensation can only be made in a limited frequency range. In contrast, with the embodiment, the switch 20*b* of the compensation circuit 20 can be arranged in the vicinity of the DUT 100. Thus, the effect of the wiring impedance can be effectively reduced, thereby providing improved responsiveness.

Advantage 4.

With conventional techniques, such an arrangement requires a D/A converter that corresponds to the range and resolution of the compensation for the power supply voltage. Accordingly, such an arrangement has a disadvantage from the point of view of the circuit area or circuit design. In contrast, with the embodiment, a compensation current is intermittently injected according to a 1-bit pulse sequence so as to compensate for fluctuation in the power supply voltage.

Seen from another point of view, it can be understood that, for such a configuration, the capacitor Cs connected to the power supply terminal 102 of the DUT 100 functions as a low-pass filter for the high-speed-switched current. Thus, by optimizing the cutoff frequency of the low-pass filter and the switching frequency, such an arrangement employing such a single-bit compensation control pattern provides sufficiently high-level compensation and resolution. Furthermore, it is only necessary to use a typical function installed in the test apparatus in order to generate such a single-bit pulse sequence. Thus, such an arrangement has an advantage in that it can be easily designed, and an advantage of a small number of additional circuits to be provided.

Second Embodiment

Figure 4:
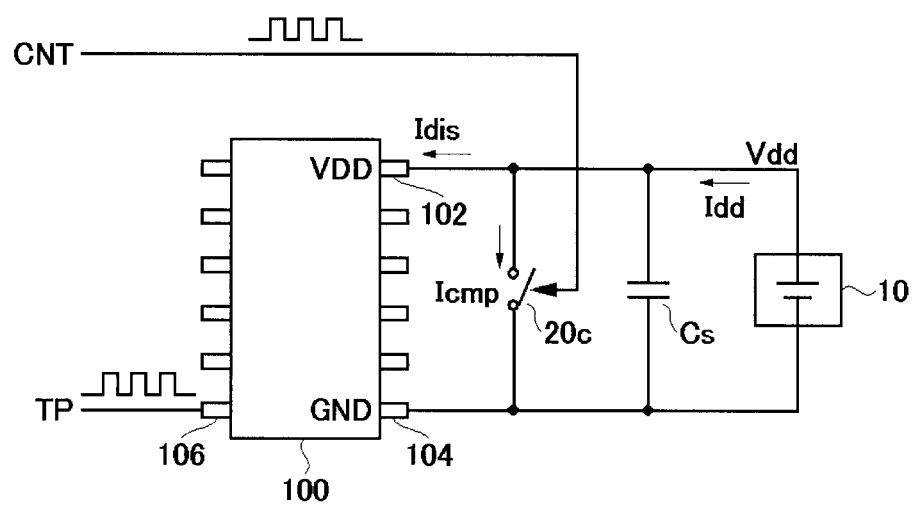
FIG. 4 is a circuit diagram which shows a configuration of a compensation circuit of a test apparatus according to a second embodiment.

FIG. 4 is a circuit diagram which shows a configuration of a compensation circuit of a test apparatus 200*a* according to a second embodiment. The components other than the compensation circuit are configured in the same way, and accordingly, description thereof will be omitted. A compensation circuit 20*c* shown in FIG. 4 intermittently draws part of a power supply current Idd as a compensation current Icmp from the main power supply 10, via a path different from the path including the DUT 100.

The compensation circuit shown in FIG. 4 is arranged between both terminals of the main power supply 10, and includes a switch 20*c* which is turned on and off according to the control pattern CNT.

The control pattern generator (not shown) changes the duty ratio of the pulse sequence of the control pattern CNT according to the operating state of the DUT 100. The operating state of the DUT 100 is controlled according to the test pattern supplied to the I/O terminals 106. Accordingly, the control pattern generator 22 generates the control pattern CNT having a pulse sequence that corresponds to the test pattern, and supplies the test pattern thus generated to the switch 20*c*.

With the second embodiment, the control pattern generator (not shown) generates the control pattern CNT as follows.

The control pattern generator changes the duty ratio of the pulse sequence of the control pattern CNT such that the sum total of the compensation current Idis that flows into the power supply terminal 102 of the DUT 100 and the compensation current Icmp drawn by the switch 20*c* of the compensation circuit is continuous over time, i.e., such that the power supply current Idd that flows from the main power supply 10 is continuous.

Figure 5A:
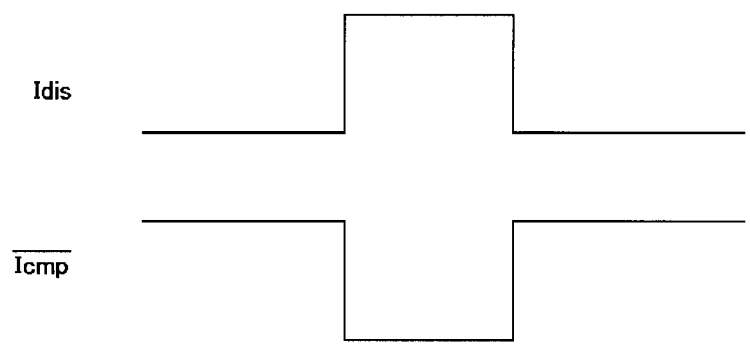
FIGS. 5A and 5B are time chart showing the relation between a compensation current provided by the compensation circuit shown in FIG. 4 and a consumed current.
Figure 5B:
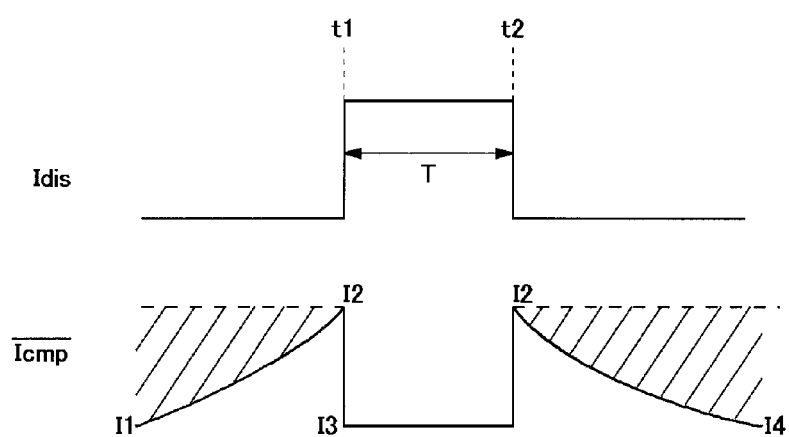

The above is the configuration of the compensation circuit 20*c* according to the second embodiment. Next, description will be made regarding the operation thereof. FIGS. 5A and 5B are time charts showing the relation between the compensation current Icmp provided by the compensation circuit 20*c* shown in FIG. 4 and the consumed current Idis.

FIG. 5A shows an arrangement in which the duty ratio of the control pattern CNT is set such that Idis+Icmp is maintained at a constant level. Such a control pattern CNT can also be generated according to the flowchart shown in FIG. 2. The waveform of the compensation current Icmp shown in FIG. 5A represents the envelope (average value) of the intermittently provided waveform.

With such a control operation shown in FIG. 5A, even if the consumed current Idis changes due to the change in the operating ratio of the DUT 100, the current that corresponds to the reduction in the consumed current Idis flows to the switch 20*c* side, thereby maintaining the power supply current Idd that flows from the main power supply 10 at a constant level. Thus, such an arrangement is capable of generating the power supply voltage Vdd at a constant level without involving the effects of the internal impedance thereof and the wiring impedance between the main power supply 10 and the DUT 100.

With the second embodiment, the compensation current Icmp that flows through the switch 20c is a waste current that does not contribute the operation of the DUT 100. In the time chart shown in FIG. 5A, during a period in which the consumed current Idis of the DUT 100 is small, a significant amount of compensation current Icmp flows, leading to a problem of increased overall power consumption of the test system. In a case in which this problem becomes significant, the control operation shown in FIG. 5B can be effectively employed.

In the control operation shown in FIG. 5B, when the consumed current Idis that flows into the power supply terminal 102 of the DUT 100 rises during a period between the time points t1 and t2, the compensation current Icmp is controlled as described below.

The control pattern generator changes the duty ratio of the control pattern such that the compensation current Icmp gradually rises over time before the timing t1 at which the consumed current Idis rises. Furthermore, the control pattern generator changes the duty ratio of the control pattern such that the compensation current Icmp gradually reduces over time after the timing t2 at which the consumed current Idis reduces.

Specifically, the compensation current Icmp is gradually raised over time from a first value I1 to a second value I2 before the period T. During the period T, the compensation current Icmp is set to a third value I3 that is lower than the second value I2. After such a predetermined period T elapses, the compensation current Icmp is gradually reduced over time from the second value I2 to a fourth value I4.

By performing such a control operation shown in FIG. 5B, such an arrangement provides a reduced compensation current Icmp in comparison with an arrangement shown in FIG. 5A. The current to be reduced is represented by the broken line. With such an arrangement shown in FIG. 5B, the sum total of Idis and Icmp, i.e., the power supply current Idd, is not maintained at a constant level, but changes in a slopewise manner. With such an arrangement, by setting the rate of the change such that the power supply current Idd gradually changes taking into account the frequency band of the main power supply 10, such an arrangement is capable of suppressing fluctuation in the power supply voltage Vdd by means of the feedback control operation of the main power supply 10 itself.

The above is the compensation circuit 20c according to the second embodiment. Next, description will be made regarding modifications according to the first and second embodiments.

[First Modification]

Description has been made in the first and second embodiments regarding a technique in which fluctuation in the power supply voltage is suppressed by changing the duty ratio of the pulse sequence of the control pattern. Conversely, noise may be superimposed on the power supply voltage Vdd to be supplied to the power supply terminal 102 of the DUT 100 by changing the duty ratio of the pulse sequence. When the frequency of the pulse sequence is set to a higher value than the feedback band of the main power supply 10, the fluctuation in the power supply voltage Vdd that occurs due to such a change in the duty ratio of the pulse sequence is applied as a noise component to the DUT 100. In this case, such an arrangement is capable of applying noise to the power supply voltage in synchronization with the test pattern, thereby providing measurement of noise resistance.

[Second Modification]

A typical power supply mounted in the test apparatus 200 has higher performance than that of a power supply provided to a set mounting the DUT. Accordingly, in a state in which it is mounted in a set, the device does not necessarily exhibit the same performance as it does in a state in which it is connected to the test apparatus. Accordingly, in some cases, there is a desire to simulate the performance of the power supply mounted in such a set. In this case, with the first or second embodiment, the control pattern generator 22 may change the impedance of the main power supply 10 side as viewed from the power supply terminal 102 by changing the duty ratio of the pulse sequence of the control pattern. Such an arrangement is capable of estimating the characteristics of the DUT in actual operation.

Third Embodiment

The first and second embodiments each relate to a test apparatus. A third embodiment relates to a circuit system.

Figure 6:
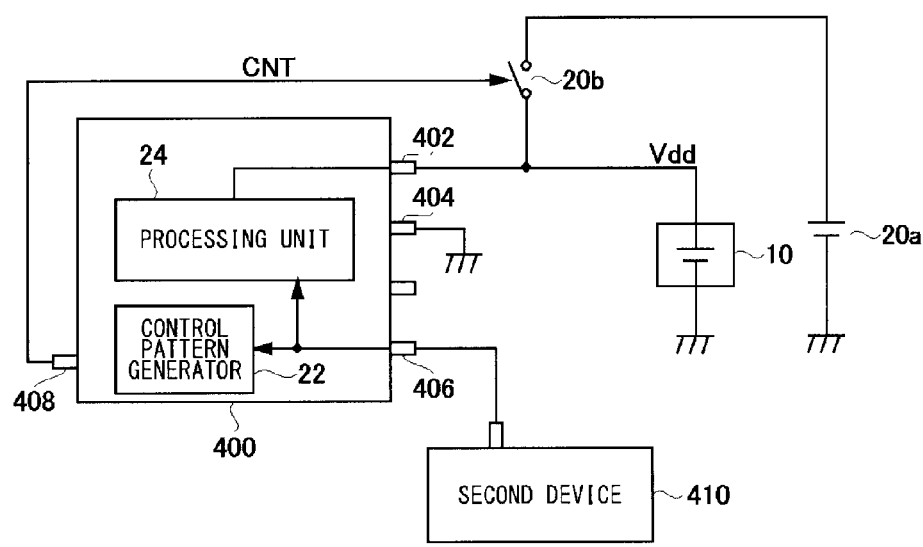
FIG. 6 is a circuit diagram which shows a configuration of a circuit system according to a third embodiment.

FIG. 6 is a circuit diagram which shows a configuration of a circuit system 300 according to the third embodiment. The circuit system 300 includes a first device 400, a second device 410, a main power supply 10, and a compensation circuit 20. The main power supply 10 and the compensation circuit 20 each have the same configurations as those in the first embodiment.

The first device 400 receives data PD via an I/O terminal 406 from the second device 410, and a processing circuit 24 provided as an internal circuit executes predetermined signal processing. The power supply voltage Vdd is supplied from the main power supply 10 to a power supply terminal 402 of the first device 400, and a ground terminal 404 thereof is grounded. The compensation circuit 20 having the same configuration as in FIG. 1 is connected to the power supply terminal 402.

The first device 400 includes the control pattern generator 22 as a built-in component, and outputs a control pattern CNT via a control terminal 408. The control pattern CNT is set according to the data output from the second device 410. The switch 20b intermittently injects a compensation current Icmp into the power supply terminal 402 of the first device 400 via a path different from the path including the main power supply 10 according to the pulse sequence of the control pattern CNT. The control pattern generator 22 may store the control patterns CNT, including the pulse sequences, modulated per data pattern, or per each kind of signal processing.

With the third embodiment, typical circuit systems can also be given the advantages as those described in the first embodiment. Next, description will be made regarding modifications of the third embodiment.

Also, a part of the compensation circuit 20, e.g., the switch 20b, may be included as a built-in component in the first device 400. The control terminal 408 is unnecessary in such an arrangement, thereby providing a reduced circuit area.

Also, the control pattern generator 22 may be included in the second device 410 as a built-in component, instead of being included in the first device 400. With such an arrangement, the second device 410 can supply the control pattern before it supplies the data pattern, thereby enabling fluctuation in the power supply voltage to be further suppressed.

With the circuit system 300 shown in FIG. 6 and the modifications thereof, the compensation circuit 20 may be configured in the same way as shown in FIG. 4. With such an arrangement, typical circuit systems can also be given the advantages described in the second embodiment.

Fourth Embodiment

A fourth embodiment relates to a power supply evaluation apparatus and a power supply evaluation method for evaluating the performance of a power supply.

Figure 7:
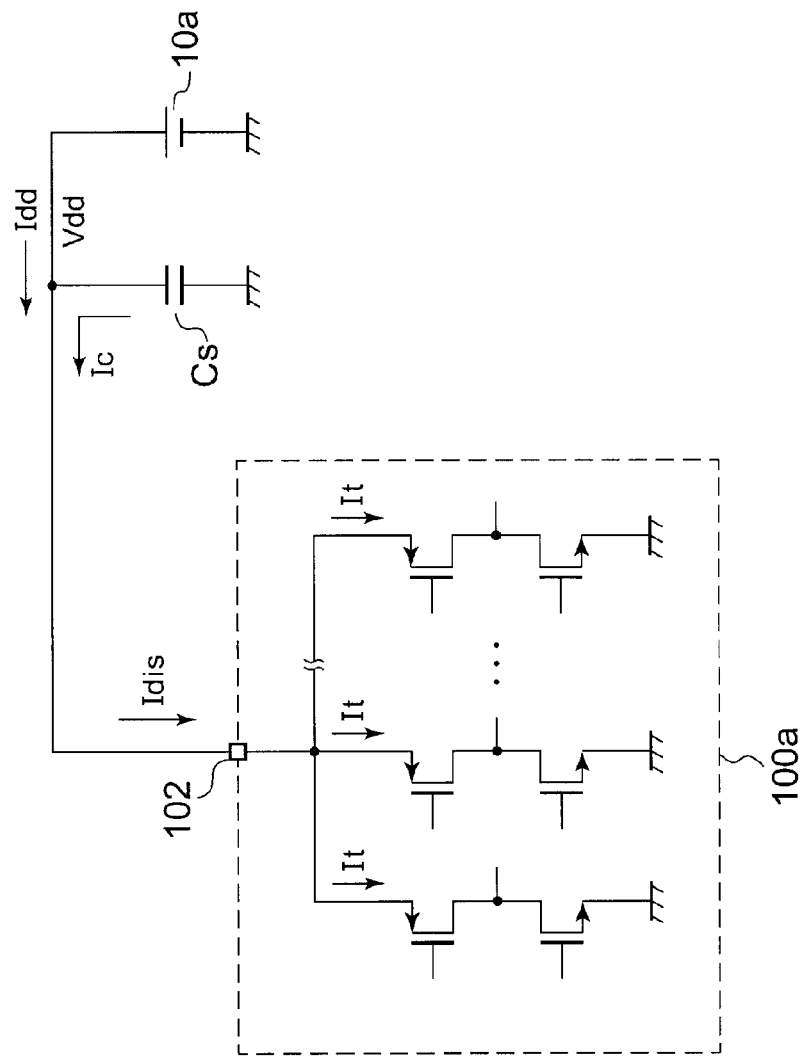
FIG. 7 is a block diagram which shows a schematic configuration of a semiconductor device and a power supply.

FIG. 7 is a block diagram which shows a schematic configuration of a semiconductor device 100a and a power supply 10a. The semiconductor device 100a is configured using the CMOS process, and includes multiple gate elements such as inverters. When a P-channel MOSFET and an N-channel MOSFET that form such an inverter are on at the same time, a through current It flows. The number (density) of paths via which such a through current flows changes according to the operating state of the semiconductor device 100a. The consumed current (which will also be referred to as the "device current" hereafter) Idis includes the through current, and a constant current component and a leak current that are not shown.

An output node 11 of the power supply 10a is connected to a power supply terminal 102 of the semiconductor device 100a. A capacitor Cs is connected to the output node 11 in order to smooth the power supply voltage Vdd. Such a capacitor Cs is provided as an internal component and/or an external component of the power supply 10a.

The device current Idis is the sum total of a current Ic that flows from the capacitor Cs and an output current Idd discharged from the power supply 10a. The power supply 10a is configured as a linear regulator or a switching regulator, and has a feedback function for maintaining the power supply voltage Vdd at a constant level. That is to say, by adjusting the output current Idd such that it follows the change in the device current Idis, the power supply 10a is capable of maintaining the power supply voltage Vdd at a constant level.

The power supply 10a has a limited feedback bandwidth. Accordingly, in a case in which the device current Idis changes rapidly, the power supply 10a cannot generate an output current Idd that follows the rapid change. Thus, a current that corresponds to the difference between the output current Idd and the device current Idis flows from the capacitor Cs. This results in fluctuation in the power supply voltage Vdd.

The through current It that flows through the semiconductor device 100a is a pulse current (impulse current) which flows for a very short period of time. Accordingly, when the through current It flows through multiple paths at the same time, the device current Idis rapidly changes at a speed exceeding the feedback speed of the power supply 10a, leading to fluctuation in the power supply voltage Vdd.

Description will be made regarding the technique for evaluating the power supply 10a based upon the aforementioned consideration.

Figure 8:
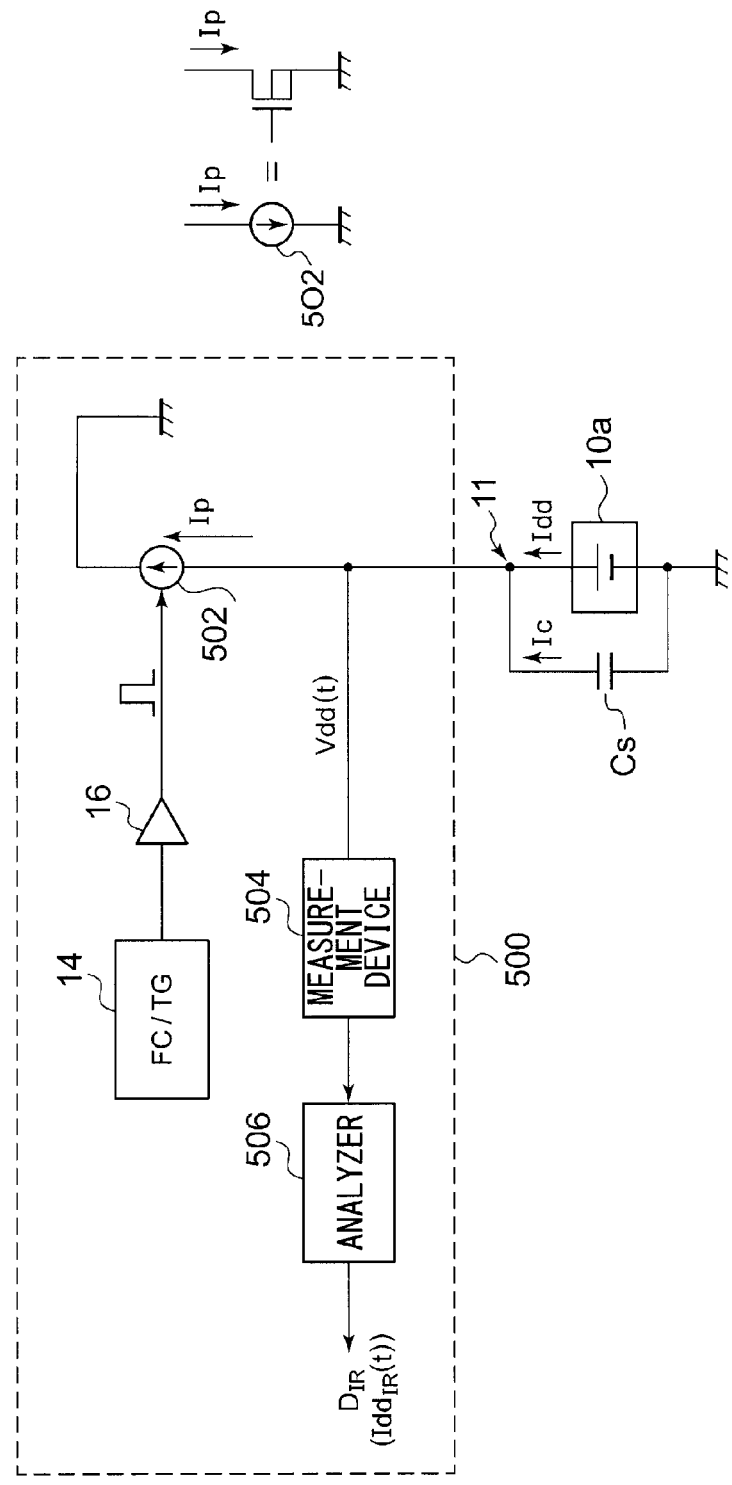
FIG. 8 is a block diagram which shows a configuration of a power supply evaluation apparatus according to a fourth embodiment.

FIG. 8 is a block diagram which shows a configuration of a power supply evaluation apparatus according to the fourth embodiment. A power supply evaluation apparatus 500 includes a current source 502, a measurement device 504, and an analyzer 506. FIG. 8 shows an arrangement in which the power supply evaluation apparatus 500 is included as a built-in component in the test apparatus 200.

The power supply evaluation apparatus 500 is connected to the power supply 10a to be evaluated. The power supply 10a is used to supply a power supply voltage Vdd to a semiconductor device (100a). However, in the evaluation operation, no semiconductor device is connected to the power supply 10a. Here, "a state in which no semiconductor device is connected to the power supply 10a" encompasses a state in which a semiconductor is connected to the power supply 10a by wiring but the semiconductor device is off, i.e., is in a high-impedance state, in addition to a state in which such a semiconductor device is not physically connected to the power supply 10a. The power supply 10a to be evaluated may be the main power supply 10 provided to the test apparatus 200 shown in FIG. 1. Alternatively, the power supply 10a to be evaluated may be another power supply to be used to supply a power supply voltage in the actual operation of the semiconductor device.

The current source 502 draws a pulse current Ip from the output node 11 of the power supply 10a, or supplies the pulse current Ip to the output node 11 of the power supply 10a. FIG. 8 shows a case in which the pulse current Ip is drawn from the output node 11. The aforementioned pulse current Ip corresponds to the through current It that flows through the semiconductor device to which the power supply 10a is to supply the power supply voltage Vdd. That is to say, the pulse width of the pulse current Ip is on the order of the transition time of the ON/OFF switching operation of each transistor that is a component of the semiconductor device when it actually operates. Seen from this point of view, the current source 502 is preferably configured employing a MOSFET as shown on the right side in FIG. 8. Also, the current source 502 may have a configuration in which an N-channel MOSFET and a P-channel MOSFET are connected in two stages. With such an arrangement in which the current source 502 is configured as a MOSFET, by determining the W/L (gate width/gate length) ratio based upon the MOSFET that is a component of the semiconductor device 100a, such an arrangement is capable of duplicating the through current It that flows through the semiconductor device 100a. It should be noted that the current source 502 may also be configured as any other type of constant current sources.

A timing generator 14 generates a pulse signal having a pulse width that corresponds to the pulse current Ip. A driver 16 turns on the current source 502 according to the pulse signal so as to generate the pulse current Ip.

The measurement device 504 measures the temporal waveform Vdd(t) of the power supply voltage, which is generated as a result of applying the pulse current Ip to the power supply 10a.

The analyzer 506 calculates the waveform of the output current $Idd_{IR}$ that is discharged from and/or sunk to the power supply 10a, based upon the temporal fluctuation waveform Vdd(t) of the power supply voltage, and generates data which represents the waveform of the output current $Idd_{IR}$ (which will be referred to as the "impulse response waveform data $D_{IR}$" hereafter).

From the law of conservation of charge, the following Expression holds true.

$$Ic(t) = -Cs \times dVdd(t)/dt \quad (1)$$

Furthermore, the following relation is introduced by applying Kirchhoff's circuit laws to the node 11.

$$Ip(t) = Idd_{IR}(t) + Ic(t) \quad (2)$$

Based upon Expressions (1) and (2), the following relation is obtained.

$$Idd_{IR}(t) = Ip(t) + Cs \times dVdd(t)/dt \quad (3)$$

In a case in which the pulse current Ip has a sufficiently short pulse width, the output current $Idd_{IR}(t)$ thus calculated can be regarded as an impulse response. The output current $Idd_{IR}(t)$ will also be referred to as the "impulse response waveform" hereafter.

The analyzer 506 is capable of receiving the waveform data of the power supply voltage Vdd(t), and generating the impulse response waveform data $D_{IR}$ based upon Expression (3). It should be noted that the data processing performed by the analyzer 506 is not restricted to such an arrangement. Also, any other approach may be used to generate the impulse response waveform data $D_{IR}$.

Figure 9:
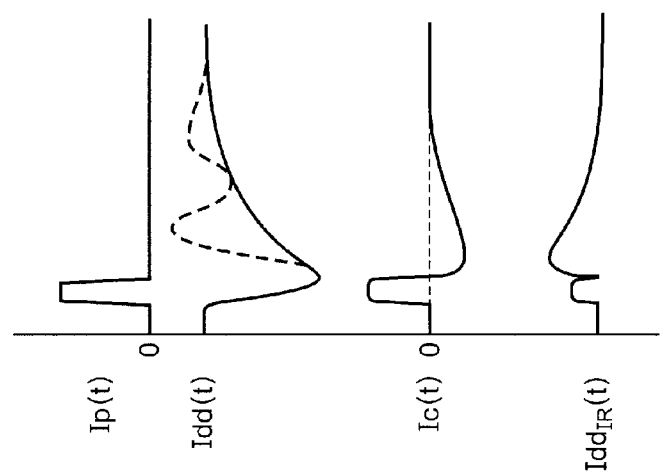
FIG. 9 is a time chart which shows an operation of the power supply evaluation apparatus shown in FIG. 8.

The above is the configuration of the power supply evaluation apparatus 500. FIG. 9 is a time chart which shows the operation of the power supply evaluation apparatus 500 shown in FIG. 8. The vertical axis and the horizontal axis shown in FIG. 9 are expanded or reduced as appropriate for ease of understanding. Also, each waveform shown in the drawing is simplified for ease of understanding.

The impulse response waveform $Idd_{IR}(t)$ thus acquired by the power supply evaluation apparatus 500 represents the responsiveness of the power supply 10a to be evaluated. That is to say, in a case in which the power supply 10a is an ideal power supply having an output impedance of zero, the output current $Idd_{IR}(t)$ perfectly matches the pulse current Ip(t). Conversely, it can be said that, if the difference between the output current $Idd_{IR}(t)$ and the pulse current Ip(t) is larger, the responsiveness of the power supply 10a is lower.

As described above, with the power supply evaluation apparatus 500 shown in FIG. 8, the performance of the power supply 10a can be evaluated.

By using the impulse response waveform $Idd_{IR}(t)$ thus obtained by the power supply evaluation apparatus 500 shown in FIG. 8, such an arrangement is capable of predicting the output current waveform Idd(t) of the power supply 10a when a given device current is applied to the power supply 10a. Furthermore, such an arrangement is capable of predicting the power supply voltage waveform Vdd(t) based upon the output current waveform Idd(t).

Detailed description will be made later in the fifth and sixth embodiment regarding this point.

Fifth Embodiment

Figure 10:
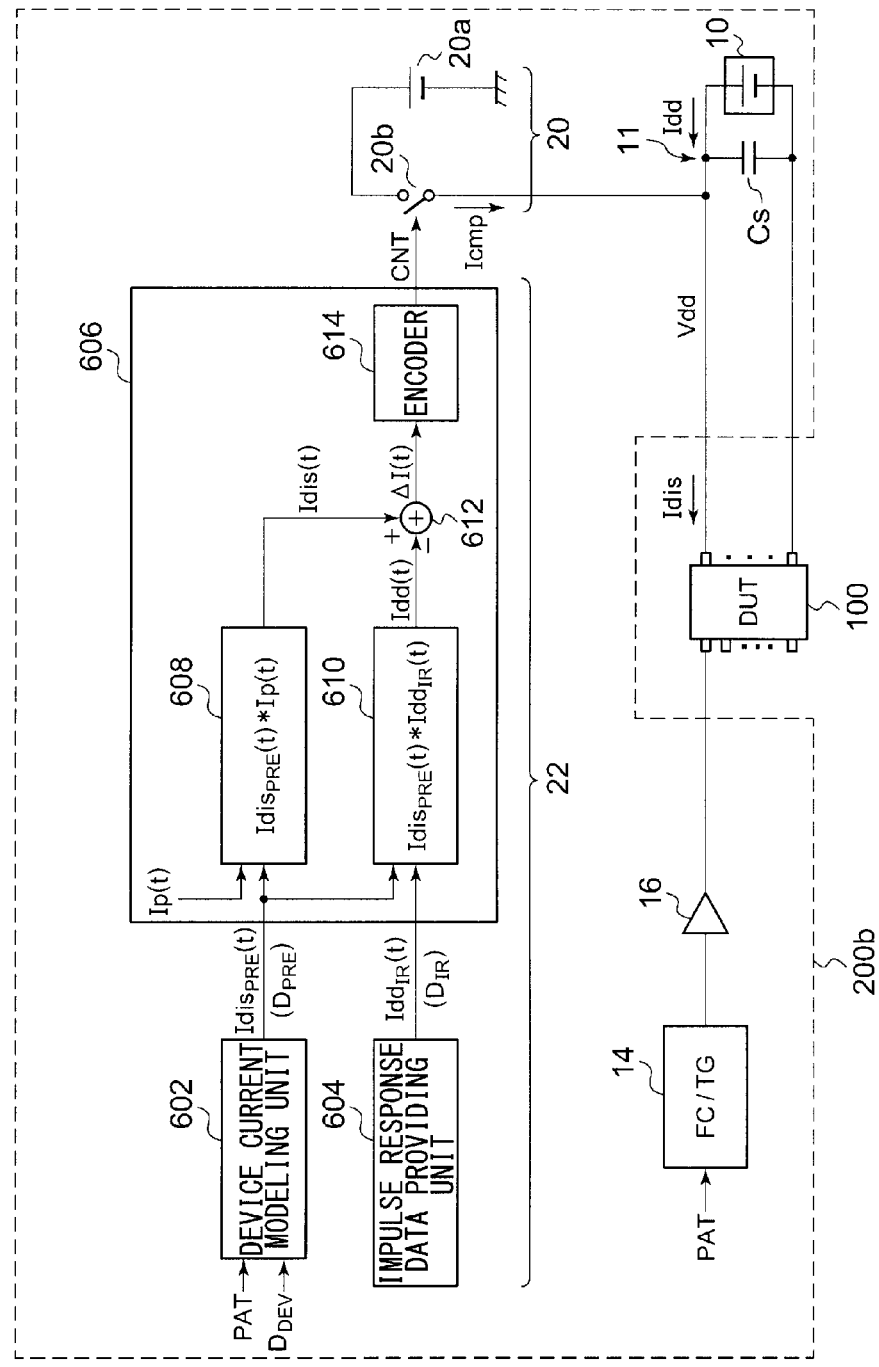
FIG. 10 is a block diagram which shows a configuration of a test apparatus according to a fifth embodiment.

Description will be made in the fifth embodiment regarding a technique for appropriately generating the control pattern data CNT for the test apparatus shown in FIG. 1 or FIG. 4. FIG. 10 is a block diagram which shows a configuration of a test apparatus 200b according to the fifth embodiment.

The components other than the control pattern generator 22 are the same as those shown in FIG. 1, and description thereof will be omitted.

The control pattern generator 22 includes a device current modeling unit 602, an impulse response waveform data providing unit 604, and a control pattern calculation unit 606.

The device current modeling unit 602 generates predicted device current waveform data $D_{PRE}$ which represents the waveform of the device current $Idis_{PRE}(t)$ that is predicted to flow through the DUT 100 when predetermined processing is executed. As described above with reference to FIG. 7, it can be assumed that the device current Idis that flows through the DUT 100 is the sum total of (the integrated value of) the unit pulse currents Ip (through currents It). Accordingly, the device current Idis can be represented by modeling in the form of a density function of the unit pulse current Ip. The function $Idis_{PRE}(t)$ may be represented by a function obtained by discretizing the device current Idis in the time-axis direction, and by normalizing the current value at each time point to the unit pulse current Ip. In a case in which the device current Idis is zero at a given point $t_1$, the density function $IdisPRE(t_1)$ is zero at the time point $t_1$. In a case in which the device current Idis is non-zero at a time point $t_2$, the density function $IdisPR(t_2)$ also becomes non-zero.

Each through current It occurs at a switching timing of a corresponding gate element included in the DUT 100. Each gate element switching event that occurs in the DUT 100 depends on the operating state of the DUT 100, and this operating state can be predicted based upon the pattern data PAT to be supplied to the DUT 100. Thus, the device current modeling unit 602 is capable of generating the predicted device current waveform data $D_{PRE}$ based upon the test pattern PAT to be supplied to the DUT 100 and the information $D_{DEV}$ with respect to the circuit configuration of the DUT 100.

The impulse response waveform data providing unit 604 outputs the impulse response waveform data $D_{IR}$ which represents the impulse response waveform $Idd_{IR}(t)$ of the output current discharged from and/or sunk to the main power supply 10 in response to the unit pulse current Ip being drawn from the main power supply 10. As the impulse response waveform data providing unit 604, the power supply evaluation apparatus 500 shown in FIG. 8 described in the fourth embodiment can be suitably employed. Alternatively, instead of using the power supply evaluation apparatus 500 shown in FIG. 8, the impulse response waveform data $D_{IR}$ may be generated by simulation or the like.

A first calculation unit 608 of the control pattern calculation unit 606 predicts the waveform of the device current Idis(t) by convolution of the waveform $Idis_{PRE}(t)$ represented by the predicted device current waveform data $D_{PRE}$ and the waveform Ip(t) of the unit pulse current.

$$Idis(t) = Idis_{PRE}(t) * Ip(t) \qquad (4)$$

Here, the symbol "*" represents the operator that represents convolution.

Furthermore, a second calculation unit 610 predicts the waveform of the output current Idd(t) of the main power supply 10 by convolution of the waveform $Idis_{PRE}(t)$ and the impulse response waveform $Idd_{IR}(t)$.

$$Idd(t) = Idis_{PRE}(t) * Idd_{IR}(t) \qquad (5)$$

A third calculation unit 612 calculates the waveform of the difference $\Delta I(t)$ between the waveform of the predicted device current Idis(t) and the waveform of the output current Idd(t) of the main power supply 10. An encoder 614 generates the control pattern CNT based upon the difference $\Delta I(t)$. The encoder 614 may generate the control pattern CNT by performing any one of $\Delta\Sigma$ modulation, pulse width modulation, or pulse density modulation on the difference $\Delta I(t)$.

The above is the configuration of the control pattern generator 22. The difference $\Delta I(t)$ is the difference between the device current Idis and the current Idd(t) which can be supplied by the main power supply 10, and represents the current component to be compensated for. Thus, by converting the difference $\Delta I(t)$ into a pulse-shaped control pattern, and by supplying the control pattern thus generated to the compensation circuit 20, such an arrangement is capable of generating the suitable compensation current Icmp. Thus, such an arrangement is capable of suppressing fluctuation in the power supply voltage Vdd.

With the test apparatus 200b shown in FIG. 10, the compensation current Icmp flows only in a direction such that it flows into the output node 11 of the main power supply 10. However, the present invention is not restricted to such an arrangement. That is to say, a switch 20c may be arranged between the ground terminal and the output node 11 of the main power supply 10, in addition to the switch 20b.

In a case in which the waveform of the power supply voltage Vdd changes monotonically as shown in FIG. 9, there is no need to provide such a compensation circuit 20c. However, in a case in which ringing is caused in the power supply voltage Vdd, as indicated by the broken line shown in FIG. 9, as a result of the effect of the pulse current Ip, it means that overcurrent occurs in the output current Idd of the main power supply 10. In such a case, by providing the switch 20c, and by generating a negative compensation current Icmp, such an arrangement is capable of further stabilizing the power supply voltage Vdd.

It should be noted that, by using Expressions (4) and (5), the waveform of the power supply voltage when the compensation current Icmp is zero, i.e., when the power supply voltage is supplied to the semiconductor device by the main power supply 10 alone, can be calculated by simulation. This means that such an arrangement is capable of predicting how the power supply voltage fluctuates when the current waveform for a given device is drawn from a given power supply.

Sixth Embodiment

Figure 11:
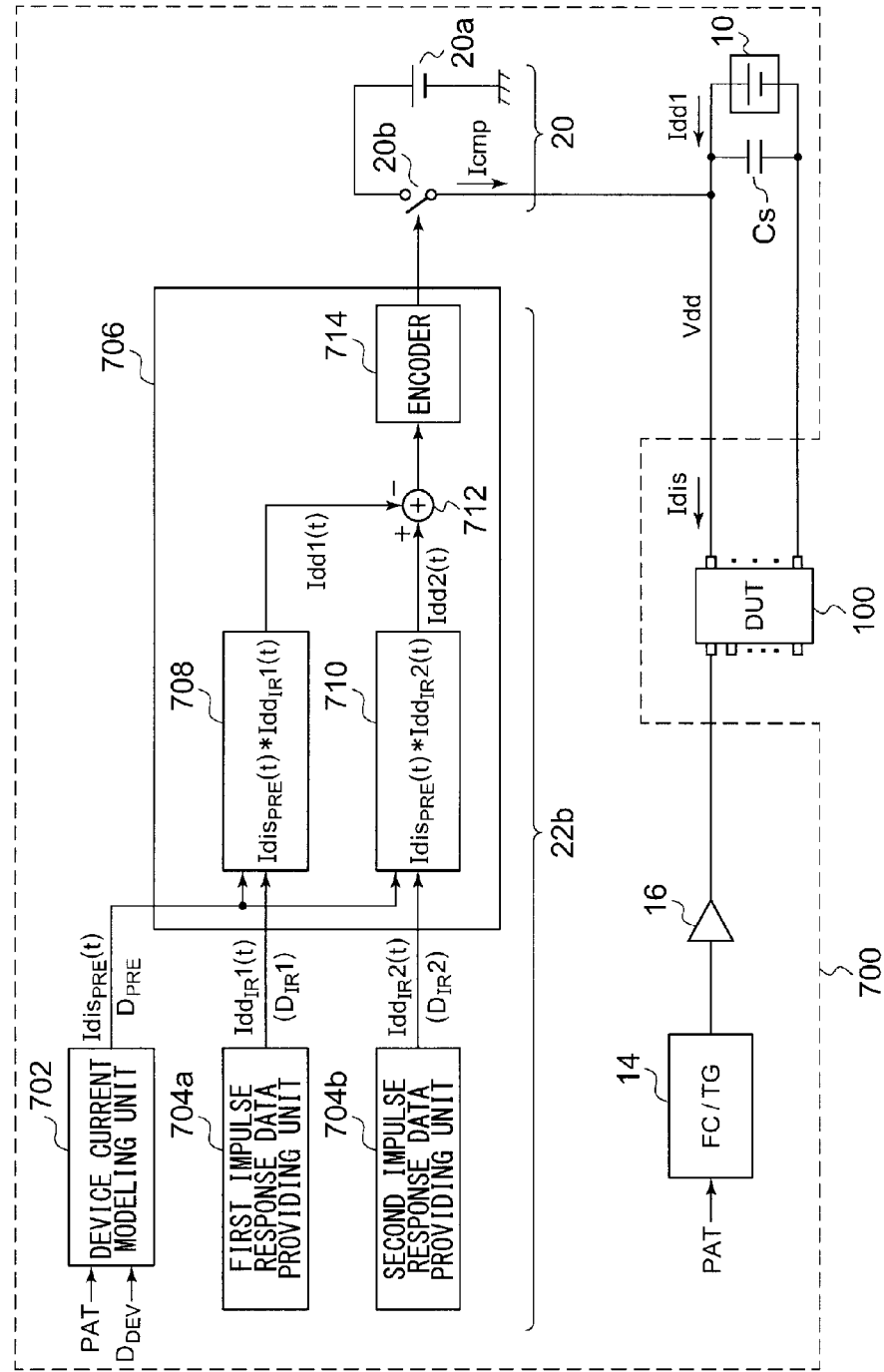
FIG. 11 is a block diagram which shows a configuration of a power supply apparatus having an emulating function according to a sixth embodiment.

A sixth embodiment relates to a technique for emulating a given power supply environment. FIG. 11 is a block diagram which shows a configuration of a power supply apparatus 700 having an emulating function according to the sixth embodiment. FIG. 11 shows an arrangement in which the power supply apparatus 700 is included as a built-in component in a test apparatus. The present invention is not restricted to such an arrangement. Also, an arrangement may be made without involving such a test apparatus.

The power supply apparatus 700 emulates a desired power supply environment using a main power supply 10 and a compensation circuit 20. A power supply to be emulated will be referred to as a "virtual power supply" in order to distinguish it from the main power supply 10.

A device current modeling unit 702 of a control pattern generator 22b generates predicted device current waveform data $D_{PRE}$ which represents the density function $Idis_{PRE}(t)$ in the same way as the device current modeling unit 602 shown in FIG. 10.

A first impulse response waveform data providing unit 704a and a second impulse response waveform data providing unit 704b each have the same configuration as that of the impulse response waveform data providing unit 604 shown in FIG. 10.

The first impulse response waveform data providing unit 704a provides first impulse response waveform data $D_{IR}1$ which represents the waveform of the output current $Idd_{IR}1(t)$ that is discharged from the main power supply 10 in response to a unit pulse current Ip being drawn from the main power supply 10.

The second impulse response waveform data providing unit 704b provides second impulse response waveform data $D_{IR}2$ which represents the waveform of the output current $Idd_{IR}2(t)$ that is discharged from the virtual power supply in response to the unit pulse current Ip being drawn from the virtual power supply (not shown) to be emulated. The first impulse response waveform data providing unit 704a and the second impulse response waveform data providing unit 704b may be configured as the power supply evaluation apparatus 500 shown in FIG. 8.

A first calculation unit 708 of a control pattern calculation unit 706 predicts the waveform of the output current $Idd1(t)$ of the main power supply 10 by convolving the density function $Idis_{PRE}(t)$ and the first impulse response waveform data $Idd_{IR}1(t)$.

$$Idd1(t)=Idis_{PRE}(t)*Idd_{IR}1(t) \quad (6)$$

A second calculation unit 710 predicts the waveform of the output current $Idd2(t)$ of the virtual power supply by convolving the density function $Idis_{PRE}(t)$ and the second impulse response waveform data $Idd_{IR}2(t)$.

$$Idd2(t)=Idis_{PRE}(t)*Idd_{IR}2(t) \quad (7)$$

A third calculation unit 712 calculates the difference $\Delta I(t)$ between the waveform of the output current $Idd1(t)$ of the main power supply 10 thus predicted and the waveform of the output current $Idd2(t)$ of the virtual power supply thus predicted.

An encoder 714 generates the control pattern CNT based upon the difference current $\Delta I(t)$.

The above is the configuration of the power supply apparatus 700. The difference $\Delta I(t)$ is the difference between the current $Idd2(t)$ that is supplied by the virtual power supply and the current $Idd1(t)$ which can be supplied in practice. Thus, by generating the control pattern CNT such that the compensation circuit 20 supplies the difference $\Delta I(t)$, such an arrangement is capable of reproducing a power supply environment in which the virtual power supply is connected to the DUT 100.

With the power supply apparatus 700 shown in FIG. 11, a switch 20c may be further arranged between the output node 11 of the main power supply 10 and the ground terminal so as to be capable of generating a negative compensation current Icmp. Such a function is required when emulating a virtual power supply having lower performance than that of the main power supply 10.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

What is claimed is:

1. A test apparatus configured to test a device under test, the test apparatus comprising:
a main power supply configured to supply a power supply voltage to a power supply terminal of the device under test;
a control pattern generator configured to generate a control pattern including a pulse sequence that corresponds to processing to be executed by the device under test; and
a compensation circuit configured to intermittently inject a compensation current into a power supply terminal of the device under test, via a path different from that of the main power supply, according to the control pattern during a period in which the device under test executes the processing;
wherein the control pattern generator comprises:
a device current modeling unit configured to generate predicted device current waveform data which defines, in the form of superposition of unit pulse currents, the waveform of a device current that is predicted to flow through the device under test when the device under test executes the processing;
an impulse response waveform data providing unit configured to generate impulse response waveform data which represents the waveform of an output current that is discharged from and/or sunk to the main power supply in response to the unit pulse current being drawn from the main power supply; and a control pattern calculation unit configured to convolve the waveform represented by the predicted device current waveform data and the waveform of the unit pulse current, to convolve the waveform represented by the predicted device current waveform data and the impulse response waveform data, and to generate the control pattern based upon the waveform difference between the two waveforms thus obtained by the two convolution operations.

2. A test apparatus configured to test a device under test, the test apparatus comprising:
a main power supply configured to supply a power supply voltage to a power supply terminal of the device under test;
a control pattern generator configured to generate a control pattern including a pulse sequence that corresponds to processing to be executed by the device under test; and
a compensation circuit configured to intermittently draw a part of the power supply current from the main power supply as a compensation current, via a path different from that of the device under test, according to the control pattern during a period in which the device under test executes the processing;
wherein the control pattern generator comprises:
a device current modeling unit configured to generate predicted device current waveform data which defines, in the form of superposition of unit pulse currents, the waveform of a device current that is predicted to flow through the device under test when the device under test executes the processing;
an impulse response waveform data providing unit configured to generate impulse response waveform data which represents the waveform of an output current that is discharged from and/or sunk to the main power supply in response to the unit pulse current being drawn from the main power supply; and
a control pattern calculation unit configured to convolve the waveform represented by the predicted device current waveform data and the waveform of the unit pulse current, to convolve the waveform represented by the predicted device current waveform data and the impulse response waveform data, and to generate the control pattern based upon the waveform difference between the two waveforms thus obtained by the two convolution operations.

3. A test apparatus according to claim 1, wherein the control pattern generator outputs the control pattern, which is used to change the compensation current, to the compensation circuit a predetermined period of time before the timing of a change in the current that flows into the power supply terminal of the device under test.

4. A test apparatus according to claim 3, wherein the test apparatus executes:
outputting the control pattern, which is used to change the compensation current, to the compensation circuit at a first timing in a state in which the device under test is instructed to perform an operation that does not cause a change in the power supply voltage; and
detecting a second timing at which electrical characteristics of the device under test change as a result of supplying the control pattern,
wherein the aforementioned predetermined period of time is determined based upon the time difference between the first timing and the second timing.

5. A test apparatus according to claim 1, wherein the wiring length between the compensation circuit and the device under test is shorter than the wiring length between the main power supply and the device under test.

6. A test apparatus according to claim 1, wherein the compensation circuit comprises:
a voltage source configured to generate a higher voltage than the power supply voltage generated by the main power supply; and
a switch arranged between an output terminal of the voltage source and the power supply terminal of the device under test, and configured to switch on and off according to the control pattern.

7. A test apparatus according to claim 1, wherein the compensation circuit comprises:
a current source configured to generate a predetermined constant current; and
a switch arranged between the current source and the power supply terminal of the device under test, and configured to switch on and off according to the control pattern.

8. A test apparatus according to claim 2, wherein the compensation circuit is arranged between both terminals of the main power supply, and configured to switch on and off according to the control pattern.

9. A test apparatus according to claim 1, wherein the control pattern generator changes the duty ratio of the pulse sequence according to the operating state of the device under test.

10. A test apparatus according to claim 1, wherein the control pattern is obtained by executing:
calculating, by means of a computation device, a current that flows in a state in which a predetermined test pattern is supplied to the device under test;
subtracting a continuous component of the power supply current from the current per cycle, and calculating an amount of compensation current per cycle, based upon the results of the subtraction; and
determining the control pattern by pattern modulation so as to provide the amount of compensation current thus calculated per cycle.

11. A test apparatus according to claim 1, wherein the control pattern generator changes the duty ratio of the pulse sequence such that the difference between a current that flows into the power supply terminal of the device under test and a compensation current injected by the compensation circuit is continuous over time.

12. A test apparatus according to claim 1, wherein the control pattern generator changes the duty ratio of the pulse sequence such that the difference between a current that flows into the power supply terminal of the device under test and a compensation current injected by the compensation circuit is constant over time.

13. A test apparatus according to claim 2, wherein the control pattern generator changes the duty ratio of the pulse sequence such that the sum of the current that flows into the power supply terminal of the device under test and a compensation current drawn by the compensation circuit is continuous over time.

14. A test apparatus according to claim 2, wherein, when a current that flows into the power supply terminal of the device under test rises at a given timing, the control pattern generator changes the duty ratio of the pulse sequence such that a compensation current drawn by the compensation circuit gradually rises over time before the aforementioned given timing.

15. A test apparatus according to claim 2, wherein, when a current that flows into the power supply terminal of the device under test falls at a given timing, the control pattern generator changes the duty ratio of the pulse sequence such that a compensation current drawn by the compensation circuit gradually falls over time after the aforementioned given timing.

16. A test apparatus according to claim 1, wherein the control pattern generator superimposes noise on a power supply voltage supplied to the power supply terminal of the device under test.

17. A test apparatus according to claim 1, wherein the control pattern generator changes the duty ratio of the pulse sequence so as to change the impedance of the power supply side as viewed from the power supply terminal.

18. A test apparatus according to claim 1, further comprising a pattern generator configured to generate a test pattern to be output to the device under test,
wherein the control pattern is determined beforehand per test pattern.

19. A test apparatus according to claim 1, further comprising a pattern generator configured to generate a test pattern to be output to the device under test,
wherein the control pattern generator is configured to generate the control pattern in synchronization with the test pattern.

20. A test apparatus according to claim 1, wherein the control pattern generator generates the control pattern using any one of $\Delta\Sigma$ modulation, pulse width modulation, and pulse density modulation.

21. A test apparatus according to claim 1, wherein the device current modeling unit is configured to generate the predicted device current waveform data based upon the test pattern supplied to the device under test and the circuit configuration of the device under test.

22. A test apparatus according to claim 1, wherein the impulse response waveform data is acquired beforehand by executing:
drawing a pulse current from an output node of the main power supply or otherwise supplying a pulse current to the output node of the main power supply in a state in which the device under test is not connected to the main power supply;
measuring the waveform of fluctuation in the power supply voltage over time that occurs as a result of applying the pulse current to the main power supply; and
deriving the waveform of the output current discharged from and/or sunk to the main power supply based upon the temporal fluctuation waveform of the power supply voltage thus measured.

23. A test method for testing a device under test comprising:
supplying a power supply voltage to a power supply terminal of the device under test using a main power supply;
generating a control pattern including a pulse sequence; and
intermittently injecting a compensation current to a power supply terminal of the device under test, and/or intermittently drawing a compensation current from the power supply terminal thereof, via a path different from that of the device under test, according to the control pattern, using a compensation circuit provided in addition to the main power supply, during a period in which the device under test executes predetermined,
wherein generating the control pattern comprises:
supplying predicted device current waveform data which defines, in the form of superimposition of unit pulse currents, the waveform of device current predicted to flow through the device under test when the device under test executes the predetermined processing;
supplying impulse response waveform data which represents the waveform of output current discharged from and/or sunk to the main power supply in response to the unit pulse current being drawn from the main power supply; and
convolving the waveform represented by the predicted device current waveform data and the waveform of the unit pulse current, convolving the waveform represented by the predicted device current waveform data and the waveform represented by the impulse response waveform data, and generating the control pattern based upon the waveform difference between the two waveforms thus obtained by the two convolution operations.

24. A test apparatus according to claim 23, wherein the predicted device current waveform data is generated based upon the test pattern supplied to the device under test and information with respect to the circuit configuration of the device under test.

25. A test method according to claim 23, wherein the impulse response waveform data is acquired beforehand by executing:
drawing a pulse current from an output node of the main power supply or otherwise supplying a pulse current to the output node of the main power supply in a state in which the device under test is not connected to the main power supply;
measuring the waveform of fluctuation in the power supply voltage over time that occurs as a result of applying the pulse current to the main power supply; and
deriving the waveform of the output current discharged from and/or sunk to the main power supply based upon the temporal fluctuation waveform of the power supply voltage thus measured.

26. A power supply apparatus having an emulation function, comprising:
a main power supply configured to supply a power supply voltage to a power supply terminal of a device under test;
a control pattern generator configured to generate a control pattern including a pulse sequence; and
a compensation circuit configured to intermittently inject a compensation current into a power supply terminal of the device under test and/or to draw a part of a power supply current as a compensation current from the main power supply to a path that is different from that of the device under test, according to the control pattern during a period in which the device under test executes predetermined processing,
wherein the control pattern generator comprises:
a device current modeling unit configured to generate predicted device current waveform data which defines, in the form of superposition of unit pulse currents, the waveform of a device current that is predicted to flow through the device under test when the device under test executes the processing;
a first impulse response waveform data providing unit configured to provide first impulse response waveform data which represents the waveform of an output current discharged from and/or sunk to the main power supply in response to the unit pulse current being drawn from the main power supply;
a second impulse response waveform data providing unit configured to provide second impulse response waveform data which represents the waveform of an output current discharged from and/or sunk to a power supply to be emulated in response to the unit pulse current being drawn from the power supply to be emulated; and a control pattern calculation unit configured to convolve the waveform represented by the predicted device current waveform data and the waveform represented by the first impulse response waveform data, to convolve the waveform represented by the predicted device current waveform data and the waveform represented by the second impulse response waveform data, and to generate the control pattern based upon the waveform difference between the two waveforms thus obtained by the two convolution operations.

27. A power supply apparatus according to claim 26, wherein the first and second impulse response waveform data are each acquired by executing:

drawing a pulse current from the output node of the power supply or supplying a pulse current to the output node of the power supply;

measuring the temporal fluctuation waveform of the power supply voltage that occurs as a result of applying the pulse current to the power supply; and deriving the waveform of the output current discharged from and/or sunk to the power supply, based upon the temporal fluctuation waveform of the power supply voltage thus measured.

28. An emulation method for emulating a power supply environment, comprising:

supplying a power supply voltage to a power supply terminal of a device under test using a main power supply;

generating a control pattern including a pulse sequence; and intermittently injecting a compensation current into the power supply terminal of the device under test and/or drawing a compensation current from the power supply terminal to a path different from that of the device under test, according to the control pattern using a compensation circuit provided in addition to the main power supply, during a period in which the device under test executes predetermined processing, wherein generating the control pattern comprises:

providing predicted device current waveform data which defines, in the form of superposition of unit pulse currents, the waveform of a device current that is predicted to flow through the device under test when the device under test executes the predetermined processing;

providing first impulse response waveform data which represents the waveform of an output current discharged from and/or sunk to the main power supply in response to the unit pulse current being drawn from the main power supply;

providing second impulse response waveform data which represents the waveform of an output current discharged from and/or sunk to a power supply to be emulated in response to the unit pulse current being drawn from the power supply to be emulated; and convolving the waveform represented by the predicted device current waveform data and the waveform represented by the first impulse response waveform data, convolving the waveform represented by the predicted device current waveform data and the waveform represented by the second impulse response waveform data, and generating the control pattern based upon the waveform difference between the two waveforms thus obtained by the two convolution operations.

29. An emulation method according to claim 28, wherein the first and second impulse response waveform data are each acquired by executing:

drawing a pulse current from the output node of the power supply or otherwise supplying a pulse current to the output node of the power supply in a state in which the device under test is not connected to the power supply;

measuring the temporal fluctuation waveform of the power supply voltage that occurs as a result of applying the pulse current to the power supply; and deriving the waveform of the output current discharged from and/or sunk to the power supply, based upon the temporal fluctuation waveform of the power supply voltage thus measured.

30. A test apparatus according to claim 2, wherein the control pattern generator outputs the control pattern, which is used to change the compensation current, to the compensation circuit a predetermined period of time before the timing of a change in the current that flows into the power supply terminal of the device under test.

31. A test apparatus according to claim 30, wherein the test apparatus executes:

outputting the control pattern, which is used to change the compensation current, to the compensation circuit at a first timing in a state in which the device under test is instructed to perform an operation that does not cause a change in the power supply voltage; and detecting a second timing at which electrical characteristics of the device under test change as a result of supplying the control pattern, wherein the aforementioned predetermined period of time is determined based upon the time difference between the first timing and the second timing.

32. A test apparatus according to claim 2, wherein the wiring length between the compensation circuit and the device under test is shorter than the wiring length between the main power supply and the device under test.

33. A test apparatus according to claim 2, wherein the control pattern generator changes the duty ratio of the pulse sequence according to the operating state of the device under test.

34. A test apparatus according to claim 2, wherein the control pattern is obtained by executing:

calculating, by means of a computation device, a current that flows in a state in which a predetermined test pattern is supplied to the device under test;

subtracting a continuous component of the power supply current from the current per cycle, and calculating an amount of compensation current per cycle, based upon the results of the subtraction; and determining the control pattern by pattern modulation so as to provide the amount of compensation current thus calculated per cycle.

35. A test apparatus according to claim 2, wherein the control pattern generator superimposes noise on a power supply voltage supplied to the power supply terminal of the device under test.

36. A test apparatus according to claim 2, wherein the control pattern generator changes the duty ratio of the pulse sequence so as to change the impedance of the power supply side as viewed from the power supply terminal.

37. A test apparatus according to claim 2, further comprising a pattern generator configured to generate a test pattern to be output to the device under test, wherein the control pattern is determined beforehand per test pattern.

38. A test apparatus according to claim 2, further comprising a pattern generator configured to generate a test pattern to be output to the device under test,
   wherein the control pattern generator is configured to generate the control pattern in synchronization with the test pattern.

39. A test apparatus according to claim 2, wherein the control pattern generator generates the control pattern using any one of $\Delta\Sigma$ modulation, pulse width modulation, and pulse density modulation.

* * * * *